United States Patent [19]
Yamada

[11] Patent Number: 5,327,039
[45] Date of Patent: Jul. 5, 1994

[54] WEIGHTING TRANSDUCER FOR SURFACE ACOUSTIC WAVE FILTER

[75] Inventor: Yoshihiro Yamada, Tokyo, Japan

[73] Assignee: NEC Corporation, Japan

[21] Appl. No.: 903,007

[22] Filed: Jun. 23, 1992

[30] Foreign Application Priority Data

Jun. 27, 1991 [JP] Japan .................. 3-157067

[51] Int. Cl.$^5$ .............................. H01L 41/08
[52] U.S. Cl. ................................ 310/313 B
[58] Field of Search ............ 310/313 R, 313 B; 333/150, 154

[56] References Cited

U.S. PATENT DOCUMENTS

| | | | |
|---|---|---|---|
| 3,686,518 | 8/1972 | Hartmann et al. | 310/313 B |
| 3,866,154 | 2/1975 | Moore | 310/313 B X |
| 4,087,714 | 5/1978 | La Rosa et al. | 310/313 B |
| 4,396,851 | 8/1983 | Kishimoto et al. | 310/313 B |
| 4,521,711 | 6/1985 | Okamoto et al. | 310/313 B |
| 4,600,852 | 7/1986 | Garber | 310/313 B |
| 4,910,839 | 3/1990 | Wright | 310/313 B X |
| 4,918,349 | 4/1990 | Shiba et al. | 310/313 B X |
| 4,954,795 | 9/1990 | Choi | 310/313 R X |

OTHER PUBLICATIONS

M. Hikita et al., "Phase Weighting for Low Loss Saw Filters", 0090-5607/80/0000-0308 $0075 c 1980 IEEE, 1980 Ultrasonics Symposium, pp. 308-312.
J. Desbois, "Low Loss Saw Bandpass Filters", 0090-5607/81/0000-0017 $00.75 c 1981 IEEE, 1981 Ultrasonics Symposium, p. 17.
H. Matthews, "Surface Wave Filters", John Wiley & Sons, pp. 120-126.
M. Feldmann et al., "Surface Acoustic Waves for Signal Processing", Artech House, pp. 175-177.

Primary Examiner—Mark O. Budd
Attorney, Agent, or Firm—Ostrolenk, Faber, Gerb & Soffen

[57] ABSTRACT

According to this invention, a weighting transducer for a surface acoustic wave filter includes first, second, third bus electrodes, odd-numbered transducer fingers, and even-numbered transducer fingers. The first, second, third bus electrodes are formed on a piezoelectric substrate. The odd-numbered transducer fingers are formed on the piezoelectric substrate and consist of first transducer fingers connected to the first bus electrode and second transducer fingers connected to the second bus electrode and spaced apart from the first transducer fingers by a predetermined interval in the longitudinal direction. The even-numbered transducer fingers are formed on the piezoelectric substrate, connected to the third bus electrode, and consist of third transducer fingers overlapping the first and second transducer fingers.

4 Claims, 3 Drawing Sheets

WEIGHTING TRANSDUCER FOR SURFACE ACOUSTIC WAVE FILTER

BACKGROUND OF THE INVENTION

The present invention relates to a surface acoustic wave filter and, more particularly, to a weighting transducer for a surface acoustic wave filter.

In general, an SAW (Surface Acoustic Wave) filter is an element used for obtaining filter characteristics as follows. An IDT (interdigital transducer) which is obtained by properly weighting a piezoelectric substrate surface is arranged, and an SAW is transmitted and received by the IDT. As a characteristic feature of the SAW filter, amplitude and phase characteristics can be arbitrarily and independently designed. As a weighting transducer for a conventional surface acoustic wave filter, an apodized transducer and a withdrawal transducer are used. That is, as shown in FIGS. 3A and 3B, in the apodized transducer, overlap widths W obtained by overlapping transducer fingers 21 of a bus electrode 23 and transducer fingers 22 of the bus electrode 24 are locally changed in proportion to a weighting function. In the withdrawal transducer, as shown in FIGS. 4A and 4B, an overlap width 31 is constant, and the density of transducer fingers 32 having an overlap width is proportional to a weighting function.

Each of the above conventional weighting transducers has a drawback, and they are properly used depending on applications. That is, in the apodized method shown in FIGS. 3A and 3B, although a weighting function can be faithfully expressed by the overlap width W, the filter characteristics of a portion having a small weighting coefficient, i.e., a portion having a narrow overlap width, are easily degraded by an error caused by a diffraction effect, and an energy distribution 25 excited from a transducer is not uniform due to the distribution of weighting functions and causes a weighting loss. In addition, in the withdrawal method shown in FIGS. 4A and 4b, although an energy distribution 35 excited from a transducer is uniform, since weighting functions are expressed by a change in density caused by the presence/absence of overlap widths, a quantization error is larger than that of the apodized method, and desired characteristics are not easily obtained.

SUMMARY OF THE INVENTION

It is an object of the present invention to provide a weighting transducer for a surface acoustic wave filter designed to reduce diffraction degradation of an SAW and a weighting loss.

It is another object of the present invention to provide a weighting transducer for a surface acoustic wave filter which can eliminate limits in design caused by a quantization error.

In order to achieve the above objects, according to the present invention, there is provided a weighting transducer for a surface acoustic wave filter, comprising first, second and third bus electrodes formed on a piezoelectric substrate, odd-numbered transducer fingers which are formed and periodically arranged on the piezoelectric substrate and consist of first transducer fingers connected to the first bus electrode and second transducer fingers connected to the second bus electrode. The first transducer fingers and the second transducer fingers are spaced from each other by a predetermined interval in the longitudinal direction of the transducer fingers, and even-numbered transducer fingers which are formed and periodically arranged on the piezoelectric substrate hauling third transducer fingers, connected to the third bus electrode, the third transducer fingers overlapping the first and second transducer fingers wherein a sum of an interdigitized distance between one of the first transducer fingers and one of the third transducer fingers adjacent each other, and an interdigitized distance between one of the second transducer fingers and one of the third transducer fingers adjacent each other is set to be constant with respect to a transmission direction of a surface acoustic wave.

DESCRIPTION OF THE PREFERRED EMBODIMENT

The present invention will be described below with reference to the accompanying drawings.

Figures 1A, 1B:
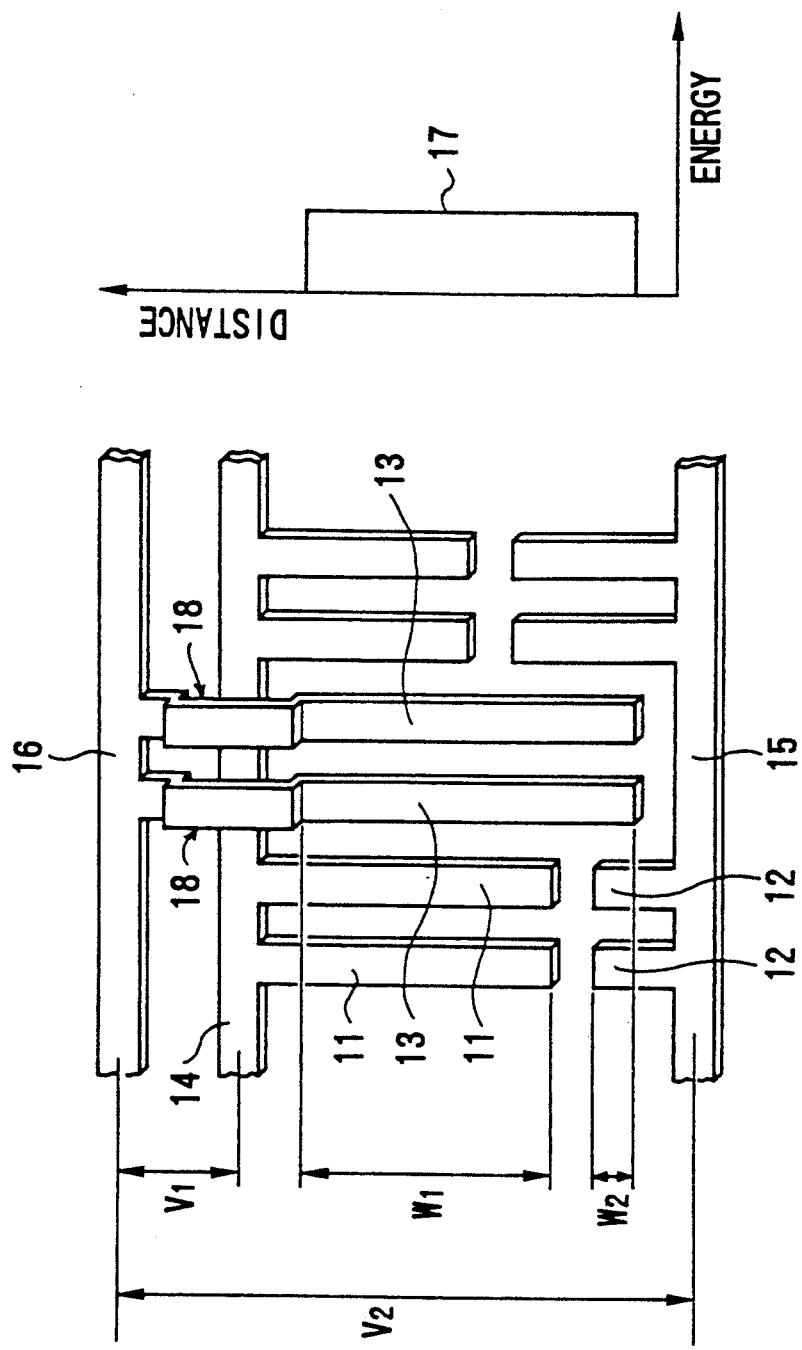
FIG. 1A is a perspective view showing a weighting transducer according to an embodiment of the present invention.
FIG. 1B is a graph showing a surface acoustic wave energy distribution of the weighting transducer in FIG. 1.

FIG. 1A shows a weighting transducer according to an embodiment of the present invention, FIG. 1B shows an energy distribution of an SAW. In FIG. 1A, reference numerals 11 to 13 denote transducer fingers; and 14 to 16, first to third bus electrodes arranged parallelly to each other. These elements are formed on a piezoelectric substrate. The transducer fingers 11 and 12 located at odd-numbered positions are connected to the first bus electrode 14 and the second bus electrode 15, respectively, and spaced from each other by a predetermined interval in the longitudinal direction of the transducer fingers. On the other hand, the transducer fingers 13 located at even-numbered positions are connected to the bus electrode 16 and constitute an interdigital transducer together with the transducer fingers 11 and 12. Reference numeral 18 denotes a crossover portion between the first bus electrode 14 and the transducer finger 13 of the third bus electrode 16, and the first bus electrode 14 and the transducer finger 13 are insulated from each other by a method to be described later. Note that the transducer fingers 11, 12, or 13 constitute pairs of transducer fingers.

An overlap width W1 between the transducer fingers 11 and 13 and an overlap width W2 between the transducer fingers 12 and 13 do not vary depending on their positions but are always set to be constant with respect to a transmission direction of an SAW. Therefore, an energy distribution 17 of the SAW is uniform as shown in FIG. 1B.

In addition, when a voltage V1 applied across the bus electrodes 14 and 16 is set to be equal to a voltage V2 applied across the bus electrodes 16 and 15, i.e., the potential of the bus electrode 16 is set to be an intermediate value between the potentials of the bus electrodes 14 and 15, the strength of an SAW excited from the overlap widths W1 and W2 is proportional to (W1−W2).

Although the above transducer fingers are conveniently odd-numbered and even-numbered, they may be reversed to each other.

A transducer weighted according to the present invention will be compared with a transducer weighted by a conventional method below.

TABLE 1

| Weighting Method | Weighting Accuracy | Weighting Loss | Resistance to Secondary Effect Degradation |
|---|---|---|---|
| Apodized | ⊙ | x | x |
| Dog-leg | △ | ○ | ○ |
| Withdrawal | x | ⊙ | ⊙ |
| Phase | △ | ○ | ○ |
| Present Invention | ⊙ | ○ | ○ |

Table 1 shows comparison of characteristics required for weighting transducers. The marks in Table 1 represent degrees of characteristics. In the conventional known weighting methods, as shown in Table 1, all the characteristics cannot be satisfied.

In contrast to this, according to the present invention, weighting accuracy is particularly improved, and all the characteristics can be satisfied.

For example, in the apodized method having the above drawbacks, overlap widths are structurally and gradually changed depending on positions, and analog weighting can be performed. In each of the dog-leg method and the withdrawal method, although a uniform overlap width can be obtained, only digital weighting is performed. In the phase method, a uniform overlap width is obtained, and analog weighting can be performed, but weighting accuracy is degraded when a frequency is shifted from a center frequency to express a phase. Note that, as secondary effects, there are a re-excitation effect, a reflection wave generated from a transducer resistor or transducer, diffraction of an SAW, and the like. The present invention has characteristics equal to those of the apodized method in weighting accuracy and characteristics almost equal to those of the dog-leg method, the withdrawal method, and the phase method in the weighting loss and resistance to secondary effect degradation.

Figure 2A:
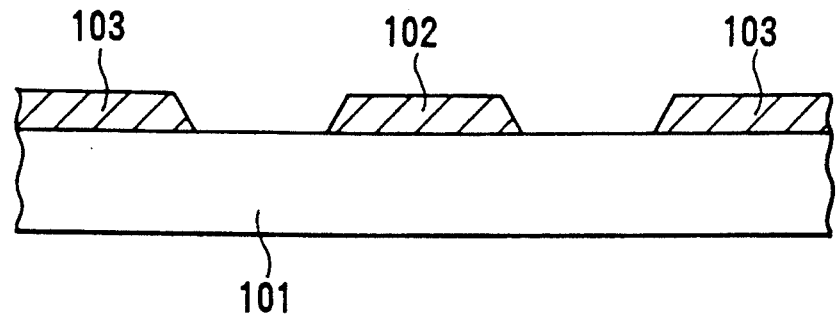
FIGS. 2A to 2C are views showing a method of forming a crossover portion of the transducer shown in FIG. 1.
Figure 2B:
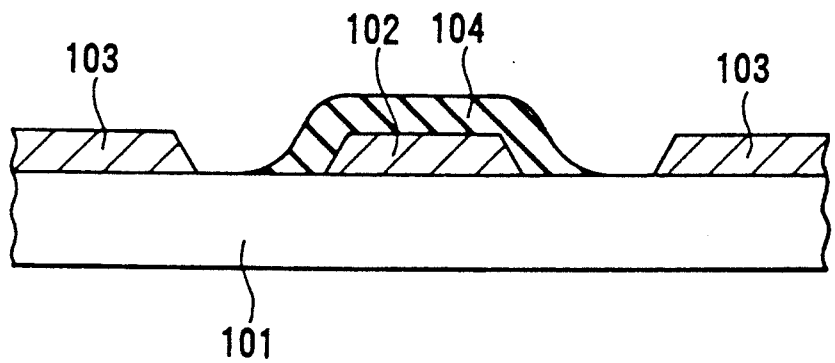
Figure 2C:
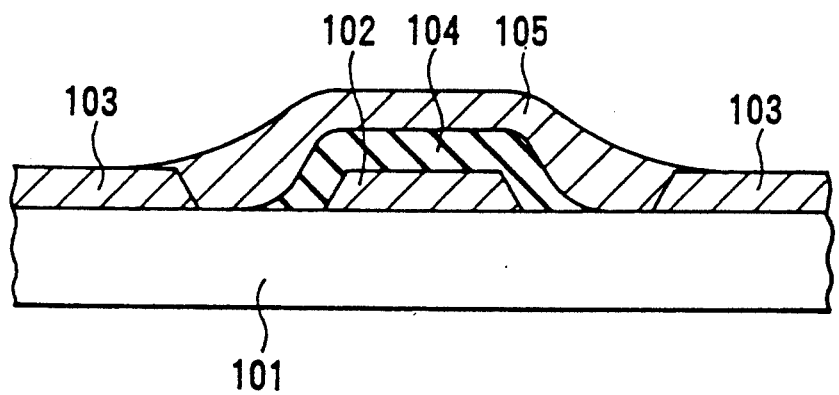
Figure 3A:
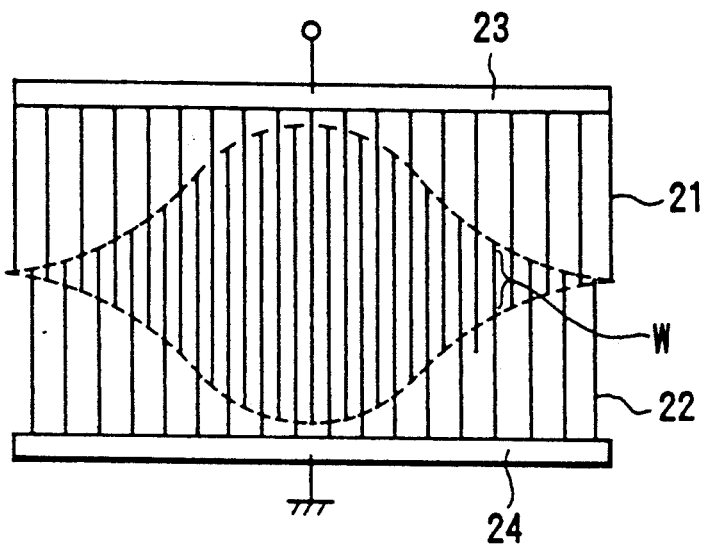
FIG. 3A is a plan view showing a conventional apodized transducer.
Figure 3B:
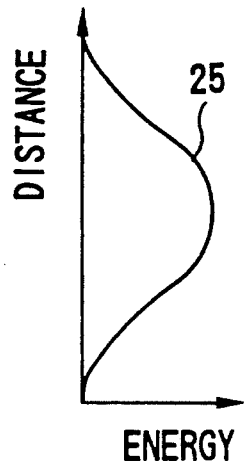
FIG. 3B is a graph showing a surface acoustic wave energy distribution of the apodized transducer in FIG. 3A.
Figure 4A:
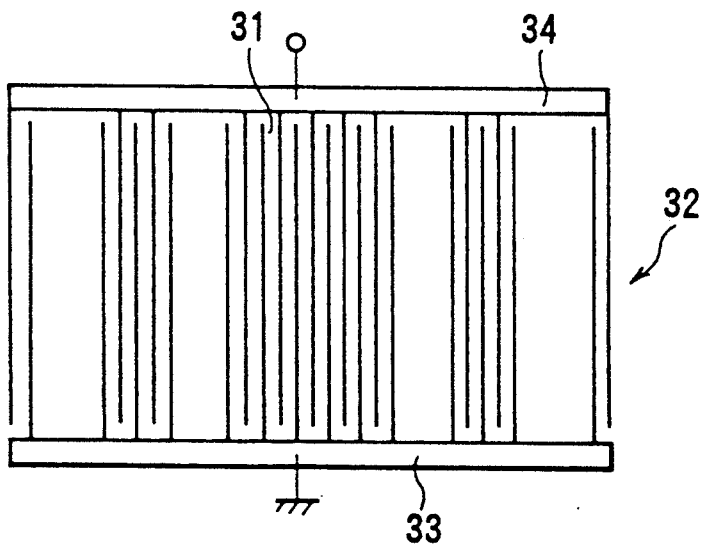
FIG. 4A is a plan view showing a conventional withdrawal transducer.
Figure 4B:
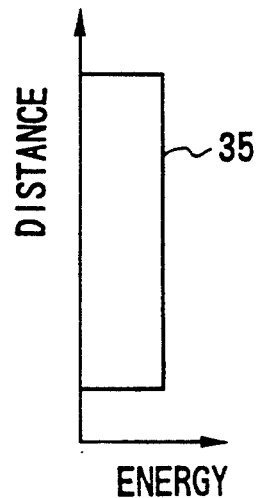
FIG. 4B is a graph showing a surface acoustic wave energy distribution of the withdrawal transducer in FIG. 4A.

FIGS. 2A to 2C show a method of forming a crossover portion of an IDT shown in FIG. 1A. As shown in FIG. 2A, metal layers 102 and 103 such as an IDT, a bus bar, and a bonding pad are formed on a substrate 101. As shown in FIG. 2B, the metal layer 102 at the crossover portion is covered with an insulating layer 104. A crossover metal layer 105 is formed on the substrate 101 and the insulating layer 104 to connect the metal layers 103 of the first layer to each other.

As described above, according to the present invention, although an overlap width is constant (W1+W2) independently of positions, since the excitation strength of an SAW is proportional to (W1−W2), degradation which is a drawback of a conventional apodized transducer and is caused by a diffraction effect is very small, and limits in design caused by a quantization error as in a conventional withdrawal transducer can be eliminated. Therefore, the present invention can be freely applied.

What is claimed is:

1. A weighting transducer for a surface acoustic wave filter, comprising:
   a first, a second and a third bus electrode; and
   respective pluralities of first, second and third transducer fingers, formed and periodically arranged on a surface of a piezoelectric substrate in a transmission direction of a surface acoustic wave,
   wherein said first transducer fingers are connected to said first bus electrode and said second transducer fingers are connected to said second bus electrode, each of said first transducer fingers forming a pair with corresponding one of said second transducer fingers so as to form a plurality of pairs of transducer fingers,
   each said pair of transducer fingers being arranged on the surface of said piezoelectric substrate so as to be in opposing positions to each other along the surface of the piezoelectric substrate, and being spaced from each other by a predetermined interval in a longitudinal direction of the transducer fingers; and
   said third transducer fingers being connected to said third bus electrode,
   said third transducer fingers being interdigitated with said plurality of pairs of transducer fingers such that each of said third transducer fingers overlaps with a respective one of said plurality of pairs of transducer fingers in the longitudinal direction of the transducer fingers, thereby defining a respective overlap distance with each transducer finger of said respective pair of transducer fingers, and
   wherein a sum of said overlap distance between the first transducer finger of said respective pair of transducer fingers and the respective third transducer finger, adjacent each other, and the overlap distance between the second transducer finger of said respective pair of transducer fingers and said respective third transducer finger is equal to the corresponding sums of the respective overlap distances of the other of the interdigitated said third transducer fingers and said pairs of transducer fingers.

2. A transducer according to claim 1, wherein a potential of said third bus electrode is set so as to be an intermediate value between a potential of said first bus electrode and a potential of said second bus electrode.

3. A transducer according to claim 1, wherein at least one of said first, second and third transducer fingers comprises pairs of transducer fingers.

4. A transducer according to claim 1, further comprising a crossover portion, formed on said piezoelectric substrate, in which said third transducer fingers and either of said first bus electrode and second bus electrode cross over and are insulated from each other.

* * * * *